United States Patent [19]

Serrano

[11] 4,290,061

[45] Sep. 15, 1981

[54] ELECTRICALLY INTEGRATED TOUCH INPUT AND OUTPUT DISPLAY SYSTEM

[75] Inventor: Juan de J. Serrano, Seymour, Conn.

[73] Assignee: General Electric Company, Louisville, Ky.

[21] Appl. No.: 69,001

[22] Filed: Aug. 23, 1979

[51] Int. Cl.³ .............................................. G06F 3/14
[52] U.S. Cl. ................................ 340/712; 340/365 C; 340/365 VL
[58] Field of Search ............ 340/712, 365 C, 365 VL, 340/756, 765

[56] References Cited

U.S. PATENT DOCUMENTS

| | | | |
|---|---|---|---|
| 3,207,905 | 9/1965 | Bray | 340/712 |
| 3,322,485 | 5/1967 | Williams | 340/784 |
| 3,757,322 | 9/1973 | Barkan et al. | 340/712 |
| 3,971,013 | 7/1976 | Challoner et al. | 340/712 |
| 4,017,848 | 4/1977 | Tannas, Jr. | 340/712 |
| 4,078,257 | 5/1978 | Bagley | 340/712 |
| 4,112,429 | 9/1978 | Tsuha et al. | 340/712 |
| 4,121,204 | 10/1978 | Welch et al. | 340/712 |
| 4,186,392 | 1/1980 | Holz | 340/712 |

Primary Examiner—Marshall M. Curtis
Attorney, Agent, or Firm—Bernard J. Lacomis; Radford M. Reams

[57] ABSTRACT

A user touch input and output display system which combines elements of a capacitive attenuator type touch switch and a display into a single system. In one embodiment type, one of the electrodes of the display performs double duty as a rear pad, for example a transmitter pad, of a capacitive attenuator type touch switch. The other rear pad necessary for operation of a capacitive attenuator touch switch may either be within the same chamber or envelope as the display electrodes, or may be outside the chamber. The display may for example be a gas discharge display, and the shared electrode does double duty as the display anode and a touch switch transmitter pad. Alternatively, the display may be a liquid crystal display. In embodiments where the other rear pad is within the chamber, to avoid noise interference to the touch switch caused by the gaseous discharge, it is preferable to operate the system in a display mode and in a touch switch mode at different times. During the touch switch mode, the display anode which also serves as the touch switch transmitter pad is supplied with an effectively AC signal. During the display mode, the display anode may be supplied with either a pulsating or a steady DC voltage. In another embodiment type, a liquid crystal display is driven by an AC voltage source having a high series impedance, and a display electrode is capacitively coupled to a touch pad. When a user touches the pad, sufficient signal is shunted to ground to drop the voltage across the display electrode below that necessary to maintain visible energization.

30 Claims, 11 Drawing Figures

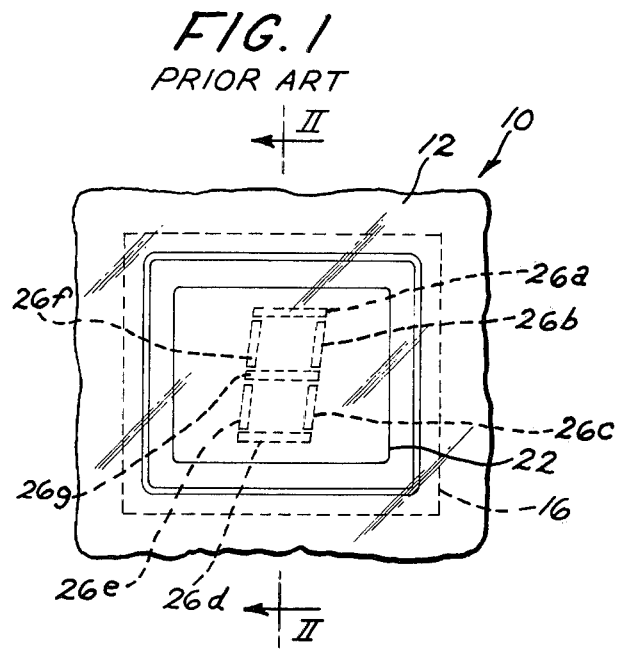
FIG. 1 PRIOR ART
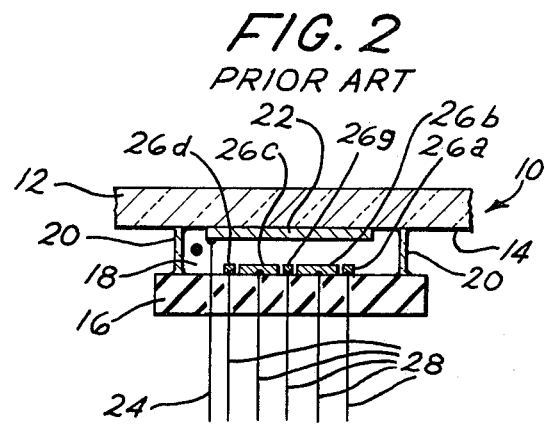
FIG. 2 PRIOR ART
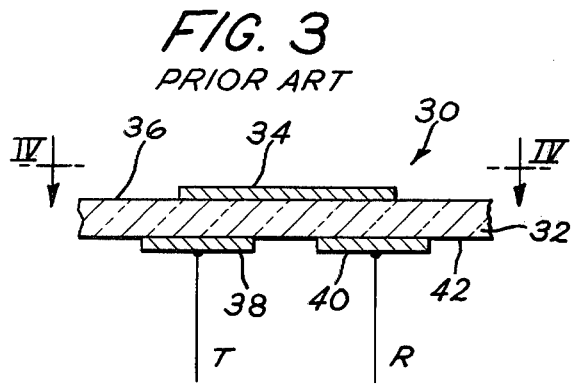
FIG. 3 PRIOR ART
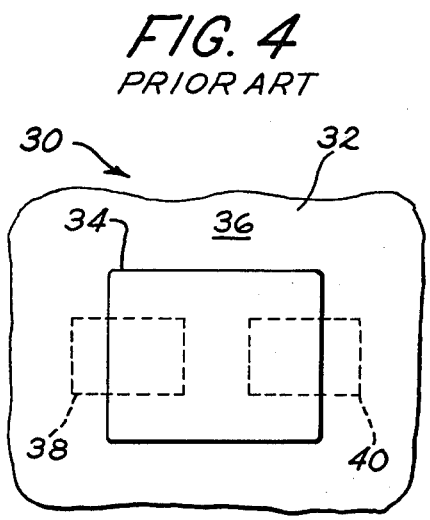
FIG. 4 PRIOR ART
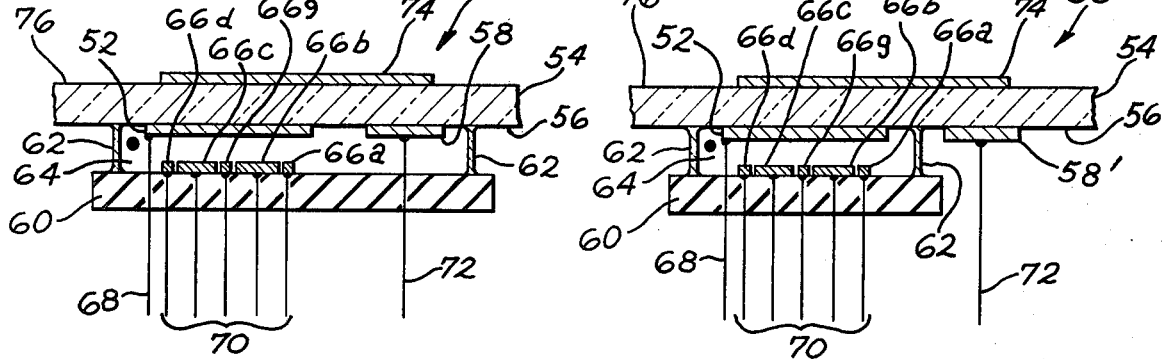
FIG. 5
FIG. 6

ELECTRICALLY INTEGRATED TOUCH INPUT AND OUTPUT DISPLAY SYSTEM

BACKGROUND OF THE INVENTION

The present invention relates to input/output systems which conveniently combine or integrate a touch switch for data entry and a display device for data output.

It has long been recognized that in many control applications it is desirable to combine a display such as an indicator light, with a switch actuating element essentially superimposed over the display. One common approach is to provide a display lamp or the like and a more or less transparent switch superimposed over the lamp. Advantages of such an approach include immediate feedback to the user at the physical location and moment of contact, savings in required panel area where input and output devices can be colocated, and potential savings in cost where one device serves the functions of two devices at less than the total cost of two devices.

Examples of devices wherein data entry switches and display devices are integrated in various manners and to various degrees are provided by the following U.S. Pat. Nos. 3,207,905—Bray; 3,757,322—Barkan et al.; 4,017,848—Tannis, Jr.; 4,078,257—Bagley; 4,112,429—Tsuha et al and 4,121,204—Welch et al. In each of the devices disclosed in these patents, the data input switches and the display output elements are generally separately identifiable devices with merely a physical connection between the two.

Other integrated entry/display systems have been disclosed wherein there is electrical interaction between the data input elements and the display output elements. One example of this general approach is a technique wherein an electrically conductive area (such as a NESA spot) is applied to the outer envelope of a cold cathode gaseous discharge lamp such as a neon lamp. An exciting voltage just below that which is necessary to trigger conduction is applied to the lamp electrodes. With the display device thus just ready to trigger, an external electric field disturbance occasioned by the proximity of a finger to the NESA spot triggers conduction in the display. In addition to merely providing a visible indication, the conduction may be used to signal other circuitry that the spot has been touched. Thus a single device serves as both a switch and a display.

Another example of an integrated entry and display device with electrical interaction between the display and a touch switch, and one which is particularly relevant in the context of the present invention, is disclosed in the Challoner et al U.S. Pat. No. 3,971,013. The Challoner et al device includes an AC driven gas discharge panel display, and at least one conductive touch key located proximate the display to pick up an AC voltage from a stray field generated by the gas discharge panel display. The Challoner et al device further includes an electrical connection to the conductive touch key for the purpose of detecting a drop in the AC voltage level of the key which occurs due to the proximity of an operator's finger.

SUMMARY OF THE INVENTION

It is an object of the present invention to provide an effective integrated entry/display system where an electrical interaction between a display device and a data input touch switch is employed to advantage.

It is another object of the invention to provide such an integrated entry/display system wherein a savings in operating circuitry as well as physical structure of the entry/display device may be realized through the sharing of common elements.

Briefly stated, and in accordance with one aspect of the invention, there is provided an integrated entry/display system including a dielectric panel and a display having at least one electrode adjacent one side, for example a rear side, of the dielectric panel. In the illustrated embodiments, the display is shown both as a gas discharge display and as a liquid crystal display. Also adjacent the one side of the dielectric panel, but electrically insulated from the one display electrode, is a capacitive attenuator touch switch rear pad. A capacitive attenuator touch switch front pad is adjacent the other side (front side) of the dielectric panel and arranged for capacitive coupling through the panel with both the one display electrode and the touch switch rear pad. Suitable circuitry is provided for operating the display by applying a suitable signal to the one display electrode; and additionally for operating the one display electrode, the touch switch rear pad and the touch switch front pad all together as a capacitive attenuator touch switch by applying an effectively AC exciting voltage to one of the electrodes on the one side (rear side) of the dielectric panel and sensing the resultant signal capacitively coupled to the other of the electrodes on the rear side of the dielectric panel. To achieve capacitive attenuator touch switch operation, the circuitry operates to detect a decrease in the coupled signal when the touch switch front pad is touched.

Thus, the one display electrode serves dual functions as an element on the display and as an element of the touch switch. Preferably, this display element is the anode of a gas discharge display and also serves as the transmitter pad of a capacitive attenuator touch switch.

In the event the display is a gas discharge display, it may have a single anode and a plurality of cathodes, for example seven cathodes arranged in a configuration known as a seven segment display for the purpose of displaying numerical digits.

The capacitive attenuator touch switch rear pad may be either positioned inside the same sealed, gas-filled envelope or chamber as the electrodes for the display, or it may be located outside the gas-filled envelope. This is largely a matter of choice of fabrication technique, but in cases where the touch switch rear pad is outside of the gas-filled chamber, the problem of minimizing interference of the gas discharge display with the capacitive input touch switch is minimized.

In accordance with another aspect of the invention, in cases where operation of the display interferes with the touch switch, as likely would be the case where the touch switch rear pad is positioned within the gas-filled chamber which, when the display is operating, contains ionized gas, the capacitive attenuator touch switch is utilized for presence detection at times when information is not being displayed and the display is therefore quiescent.

In accordance with another aspect of the invention, applicable in particular to a liquid crystal display, the display is driven by an AC voltage source having a high series impedance. One of the display electrodes is capacitively coupled to a touch pad such that when the touch pad is touched sufficient signal is shunted to ground to drop the display voltage below that necessary to maintain visible energization.

The present invention therefore effectively integrates both a capacitive input touch switch and a display into a single system, making possible savings both in panel area and in driving circuitry.

BRIEF DESCRIPTION OF THE DRAWINGS

While the novel features of the invention are set forth with particularly in the appended claims, the invention, both as to organization and content, will be better understood and appreciated, along with other objects and features thereof, from the following detailed description, taken in conjunction with the drawings, in which:

FIG. 1 is a front panel view of a prior art seven segment gas discharge display device as it appears to a user;

FIG. 2 is a cross-sectional view taken along line II—II of FIG. 1;

FIG. 3 is a cross-sectional view of elements of a capacitive attenuator type touch switch;

FIG. 4 is a view taken along line IV—IV of FIG. 3 showing the capacitive attentuator type touch switch as it appears from the front of a panel;

FIG. 5 is a cross-sectional view of an embodiment of the present invention which advantageously combines elements of a prior art gas discharge display and a prior art capacitive attenuator-type touch switch;

FIG. 6 is a cross-sectional view of another embodiment of the invention illustrating one particular approach to minimizing the problem of noise interference to the capacitive touch switch portion of the device caused by operation of the display portion of the device;

DESCRIPTION OF THE PREFERRED EMBODIMENTS

Figure 7:
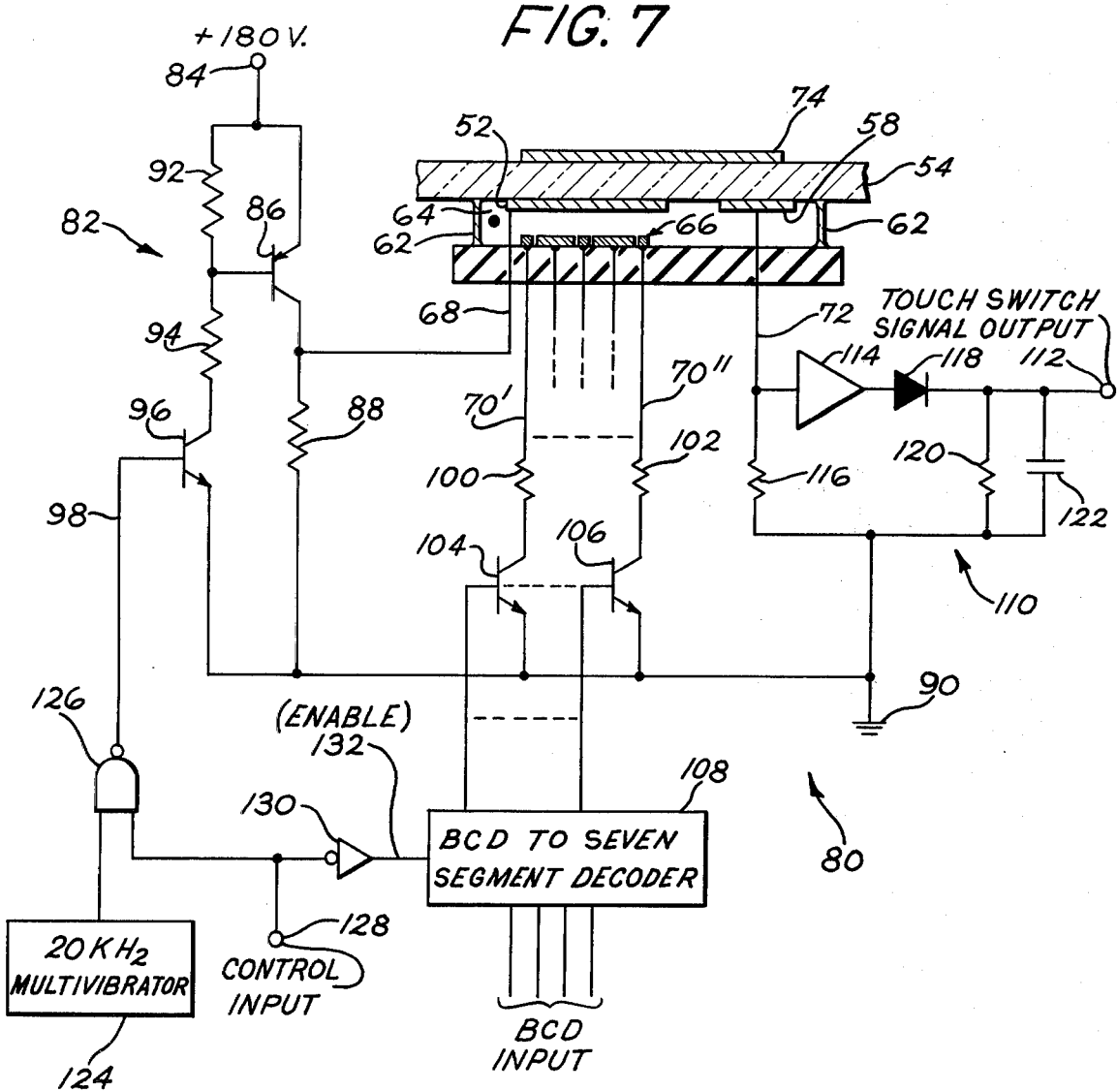
FIG. 7 is an electrical schematic diagram showing the entry/display device of FIG. 5 connected to suitable operating circuitry.

Referring first to FIGS. 1 and 2, there is shown by way of example a typical prior art gas discharge display 10 of the type which may comprise a portion of a system embodying the present invention. While the particular display 10 illustrated is of the seven segment type adapted for displaying numerals, it will be appreciated that the precise form of display is not at all important with respect to the present invention, and a display having only a single visible element may as well be employed. Further, it will be understood that the present invention is not limited to any particular type of display, and the gas discharge display 10 is shown only for purposes of convenient example.

The gas discharge display 10 includes a transparent dielectric panel 12, which preferably is glass. Spaced below one side 14 (the rear side) of the panel 12 is a dielectric sheet 16 which preferably also is glass for convenience in fabrication, but actually need not be transparent. Between the transparent dielectric panel 12 and the dielectric sheet 16 is a gas-filled envelope or chamber 18 suitably sealed around the edges thereof by means of a conventional glass frit seal 20.

Within the gas-filled chamber 18, adjacent the one side 14 of the dielectric panel 12, is a display electrode 22, which typically is an anode element to which a relatively positive potential is applied. The electrode 22 is transparent. To achieve transparency, the electrode 22 may, for example, comprise either a relatively thin coating of a conductive substance such as tin oxide or wire mesh. A lead 24 is provided for connection to the display electrode 22, and extends through the dielectric sheet.

Also within the gas-filled chamber 18 are a plurality of cathode electrodes 26a–26g which define the visible portion of the display and which are spaced from the anode electrode 22. The cathode electrodes 26a–26g have individual leads 28. As is well known in the display art, the gas-filled chamber 18 is filled with a suitable ionizable gas or mixture of gases such as neon or krypton, at relatively low pressure. When a sufficiently high voltage is applied between the anode electrode 22 and one or more of the cathodes 26a–26g, a visible glow occurs in the immediate vicinity of energized cathode electrodes. By selectively connecting the individual cathodes 26a–26g to a source of negative potential, various energization and thus display patterns can be achieved, as is well known in the art.

Referring now to FIGS. 3 and 4, essential elements of a conventional prior art capacitive attenuator-type touch switch 30 include a dielectric panel 32, which may or may not be transparent and preferably is glass, a touch pad 34 on the front surface 36 of the panel 32, and a pair of rear pads 38 and 40 on the rear surface 42 of the panel 32. The physical arrangement is such that there is capacitive coupling of the front pad or touch pad 34 through the dielectric panel 32 with both of the rear pads 38 and 40.

For the operation of the capacitive attenuator touch switch such as the prior art touch switch 30, one of the rear pads, for example the rear pad 38, is designated the transmitter (T) pad, and the other rear pad, read pad 40 in this example, is designated the receiver (R) pad. In operation, an effectively AC driving signal is applied to the transmitter pad 38 via a connecting lead 44, and a level detection circuit is connected to the receiver pad 40 via a connecting lead 46. So long as the touch pad 34 is not touched, signals are coupled through a first capacitor comprising the transmitter pad 38 and the touch pad 34 and through a second capacitor comprising the touch pad 34 and the receiver pad 40, to appear on the lead 46. When the touch pad 34 is touched, a portion of this signal is shunted to ground through the body of the user, resulting in a detectable decrease in signal coupled to the receiver pad 40 and thus available at the lead 46. By "an effectively AC signal" is meant a voltage signal which changes with time, and this may be either a true AC signal which oscillates about zero volts, or a pulsating DC signal which, after being capacitively coupled, is in effect an AC signal insofar as the circuitry is concerned.

As has been recognized, advantages of such capacitive attenuator touch switches include high reliability due to the absence of mechanical switching contacts, good appearace, insulation of the user from direct electrical connection (DC-coupled) with circuitry, and easy cleanability.

Referring now to FIG. 5, there is shown the panel associated portion 50 of one embodiment of an integrated entry/display system in accordance with the present invention. As is explained below, in the embodiment of FIG. 5, a single electrode 52 serves both as an electrode of a display and as a capacitive attenuator touch switch rear pad. In the particular embodiment illustrated and described by way of example herein, the electrode 52 serves as the anode of a gas discharge display, and as such may be compared to the anode 22 of FIGS. 1 and 2. The electrode 52 also serves in the particular embodiment illustrated as the transmitter pad of a capacitive attenuator type touch switch, and as such may be compared to the transmitter pad 38 of FIGS. 3 and 4. It will be apparent that this configuration permits a saving in physical structure. In addition, as is described in detail below with particular reference to FIG. 7, a saving resulting from commonality of driving circuitry results.

In addition, the integrated entry/display system portion 50 of FIG. 5 includes a dielectric panel 54 which is at least partly transparent, with the electrode 52 adjacent one side 56 (rear side) of the dielectric panel 54. As mentioned above, the electrode 52 serves both as one electrode of a display, and also as one rear pad of a capacitive attenuator touch switch.

Also adjacent the one side 56 (rear side) of the dielectric panel 54 is another capacitive attenuator touch switch rear pad 58 which is electrically insulated from the electrode 52.

To complete the display section of the system portion 50, a dielectric sheet 60 is spaced from the rear side 56 of the panel 54, and sealed by a glass frit seal 62 to form a sealed gas-filled chamber 64. Additionally, conventional display cathodes 66d, 66c, 66g, 66b and 66a are carried by the dielectric sheet 60 and are within the gas-filled chamber 64 such that when a voltage is applied between the display anode electrode 52 and any of the cathodes 66, the gas in the vicinity of the cathode glows to provide a visible display. A suitable lead 68 is provided for the electrode 52, suitable leads 70 for the cathodes 66, and a suitable lead 72 for the touch switch rear pad 58 are all provided.

To complete the touch switch portion of the integrated entry/display device 50 of FIG. 5, a capacitive attenuator touch switch front pad 74 is adjacent the other side 76 (front side) of the dielectric panel 54 and arranged for capacitive coupling through the panel 54 with both the one display electrode 52 and the touch switch rear pad 58.

A complete system in accordance with the present invention also includes suitable circuitry for operating the portion 50 of the entry/display system. While one example of suitable circuitry is described below with particular reference to FIG. 7, a general functional description of the circuitry with reference only to FIG. 5 follows. In particular, the circuitry operates the display section by applying a suitable signal to the one display electrode 52. In the case of a gas discharge display, this signal may be either a steady positive DC potential, or may be an alternating or pulsating DC signal, preferably at a frequency no higher that 4 kHz. In such operation, the voltage applied to the display anode electrode 52 is positive with respect to the voltage of the cathodes 66, and is typically in the order of 180 volts, although series current-limiting resistance is required, as is known in the art, due to the negative resistance characteristic of a gaseous discharge.

The circuitry also provides capacitive attenuator touch switch operation by employing the same electrode 52 which serves as the anode of the display as one of the rear pads of a capacitive attenuator type touch switch, and employing the rear pad 58 as the other rear pad. Preferably, the electrode 52 serves as the transmitter pad of the touch switch, with the rear pad 58 then serving as the receiver pad. More specifically, an effectively AC exciting voltage is applied to the electrode 52, and the resultant signal which is coupled through a first capacitor comprising the electrode 52 and the front pad 74 and through a second capacitor comprising the front pad 74 and the rear electrode 58 is sensed for the purpose of detecting a decrease in the coupled signal when the touch switch front pad 74 is touched, as in conventional capacitive attenuator type touch switch operation.

One potential problem with the embodiment of FIG. 5 where a gas discharge display is involved is that it is difficult to achieve simultaneous operation in both the display mode and the capacitor attenuator touch switch mode for the reason that the touch switch rear pad 58 comprising the touch switch output element is within the electrically noisy environment of the chamber 64 containing ionized gas. While in accordance with the invention, one approach to this particular problem is a multiplexing technique wherein the system panel portion 50 is operated in the display mode and in the capacitor attenuator touch switch mode at different times, another approach is illustrated in FIG. 6. The FIG. 6 embodiment differs from the FIG. 5 embodiment in that a touch switch rear pad 58' is outside of the gas-filled chamber 64, but still adjacent the one side 56 (rear side) of the dielectric panel 54 and still arranged for capacitive coupling with the touch switch front pad 74. This approach greatly alleviates the coupling of noise into the rear pad 58, and permits the simultaneous operation in the touch switch mode and the display mode, so long as the display portion of the system panel portion 50 is operated with an effectively AC signal on the anode element 52, which signal may be pulsating DC.

Figure 9:
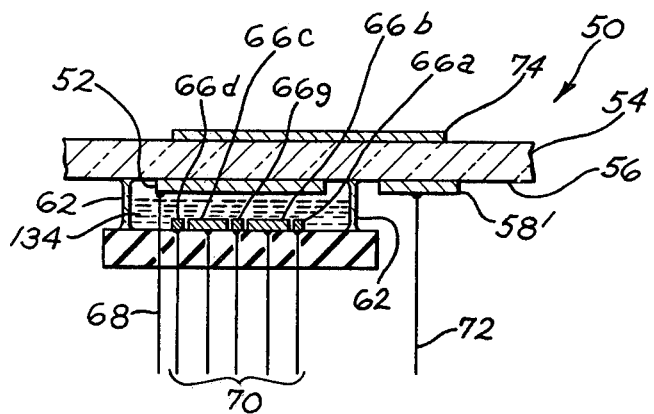
FIG. 9 is a view similar to FIG. 6, but illustrating an embodiment wherein the display portion of the device is a liquid crystal display.

While the embodiment of FIG. 6 includes elements of a high voltage gas discharge display, other display types may equally well be employed, As one particulary example, elements of a liquid output display may be included instead. This latter approach is illustrated in FIG. 9, which is described in detail hereinafter.

In FIG. 7, is shown one example 80 of circuitry suitable for the present invention where the display is a gas discharge display. The particular circuitry illustrated in FIG. 7 implements the multiplexing technique referred to above. It will be appreciated however that the circuitry 80 is only one example, and that numerous modifications are possible. It will further be appreciated that, although the circuitry of FIG. 7 is shown connected to the panel portion of the integrated entry/display system embodiment of FIG. 5, that it may as well be employed with the embodiment of FIG. 6. Additionally, while the embodiment of FIG. 7 implements one particular mode of operation, specifically a multiplexing technique, other operational modes are quite possible. Examples of such other operational modes are mentioned below following the detailed description of FIGS. 7 and 8.

It is assumed that the circuitry 80 of FIG. 7 is connected to a suitable external utilization device (not shown) which may be any type of system for which inputs and outputs are required. It is further assumed that the external utilization device has an output for controlling when the display is to operate and what numeral is to be displayed, an input responsive to the touch switch portion of the integrated entry/display system of the invention, and a control output to select either a display mode or a touch switch mode of operation. As was mentioned above, with the particular embodiment of FIGS. 5 and 7 wherein the touch switch rear pad 58 is located within the gas-filled envelope, it is highly preferable that the display portion and the capacitor touch switch portions of the system be operated at different times.

In FIG. 7, a switching subcircuit 82 controls the application of voltage from a +180 volt source 84 to the electrode 52 which serves both as the display anode and as a transmitter pad of a capacitive attenuator-type touch switch. The switching subcircuit 82 includes a PNP switching transistor 86 having its emitter connected to the +180 volt source 84, and its collector connected to the lead 68 of the electrode 52. The transistor 86 collector is also connected through a pull-down resistor 88 to circuit ground 90. The base of the transistor 86 is connected to a logic level translating network comprising resistors 92 and 94 connected in series between the +180 volt source 84 and the collector of an NPN switching transistor 96, with the base of the switching transistor 86 specifically connected to the junction between the resistors 92 and 94. The emitter of the NPN transistor 96 is connected to circuit ground 90, and an input line 98 is connected to the base of the transistor 96.

Thus when the voltage on the input line 98 is low, both of the transistors 96 and 86 are cut off, and the electrode 52 is essentially at circuit ground 90 potential. When the line 98 has a logic high voltage, than both transistors 96 and 86 conduct, and the voltage on the electrode 52 is substantially +180 volts.

In FIG. 7, the display cathodes 66 are connected by their individual leads, for example the exemplary leads 75 and 70', through current limiting resistors 100 and 102 to the collectors of representative NPN switching transistors 104 and 106. The emitters of the switching transistors 104 and 106 are connected to circuit ground 90, and the bases of these transistors are connected to the outputs of a conventional BCD to Seven Segment Decoder 108 which receives a BCD INPUT from the external utilization device (not shown). The exemplary transistors 104 and 106 thus comprise as individual control elements for selectively connecting corresponding display cathode elements 66 to a relatively negative potential.

Connected to the touch switch rear pad 58 which serves as a receiver pad is a receiver subcircuit 110 which serves to output a logic high signal at a Touch Switch Signal Output terminal 112 when the touched pad 74 is not being touched and touch switch mode operation is enabled, and to output a logic low signal on the Touch Switch Signal Output terminal 112 when the touch pad 74 is touched. Specifically, the receiver subcircuit 110 includes an AC buffer amplifier 114 having its input connected to the lead 72 from the rear pad 58. A high resistance 116 is connected between the amplifier 114 input and circuit ground 90 to stabilize the system. A rectifing diode 118 is connected in series between the output of the amplifier 114 and a parallel RC output network comprising a resistor 120 and a capacitor 122. This output network serves to rectify and smooth the output of the amplifier 114 to produce steady output logic levels.

Additionally included in the circuit 80 of FIG. 7 is a 20 kHz multivibrator 124 for generating a pulsating DC signal which, after level conversion, produces the effectively AC signal which is supplied to the electrode 52 when it is operating as a touch switch transmitter pad. While the multivibrator 124 illustrated produces a square wave output frequency of 20 kHz, this is not at all critical, and the frequency may for example be anywhere within the range of from 10 to 100 kHz and still provide proper operation of the touch switch.

The output of the 20 kHz multivibrator 124 is connected to an input of a NAND gate 126 having its output connected to the line 98 which drives the base of the switching transistor 96. To enable the NAND gate 126 to pass pulses when the touch switch mode of operation is desired, a CONTROL INPUT terminal 128 which receives a mode control signal from the external utilization device (not shown) is connected to an input of the NAND gate 126. Thus when the control input terminal 128 is at logic high, the NAND gate 126 is enabled to pass inverted pulses from the multivibrator 124. Conversely, when the CONTROL INPUT terminal 128 is low, the NAND gate 126 remains inactive (output high), turning on both the transistors 96 and 86 to apply a steady +180 volts to the display electrode 52.

In order to ensure that no conduction occurs within the gas-filled chamber 64 during capacitive touch switch mode operation, the CONTROL INPUT terminal 128 is also connected through an inverter 130 to an ENABLE input 132 of the BCD to Seven Segment Decoder 108. The BCD to Seven Segment Decoder 108 functions to drive appropriate ones of the display cathode switching transistors, such as the representative transistors 104 and 106, only when the ENABLE input 132 is high.

Figure 8:
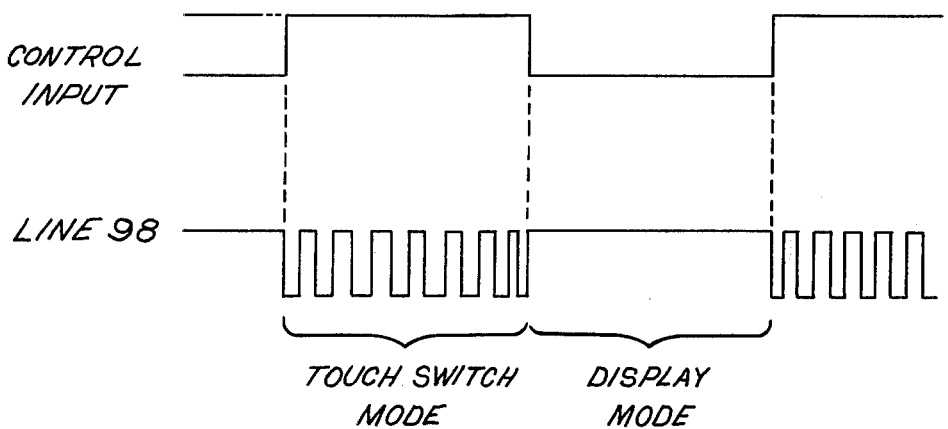
FIG. 8 illustrates electrical waveforms during operation of the circuitry of FIG. 7.

With reference now also to FIG. 8 waveforms, in the operation of the circuit 80 of FIG. 7, whenever the CONTROL INPUT terminal 128 is low, the display mode of operation is selected. In the display mode of operation, the NAND gate 126 is inactive, so that its output (line 98) is high, both transistors 96 and 86 are conducting, and a steady +180 volts DC (0 Hz) is applied to the electrode 52, which in this mode of operation functions as a display anode. With the CONTROL INPUT 128 low, the inverter 130 is activated so that the ENABLE input 132 of the BCD to Seven Segment Decoder 108 is high, and the BCD to Seven Segment Decoder 108 Drives the switching transistors 104 and 106 and thus the display cathodes 66 in response to signals on the BCD INPUT.

For the touch switch mode of operation, the CONTROL INPUT terminal 128 is high, and the NAND gate 126 is thus enabled to pass inverted pulses (line 98) from the 20 kHz multivibrator 124, and the voltage on the electrode 52 alternates at a 20 kHz rate between +180 volts and circuit ground potential. In this mode of operation, the electrode 52 is operating as the transmitter pad of a capacitive attenuator touch switch. With the CONTROL INPUT terminal 128 high, the inverter 130 is inactive, the ENABLE input 132 of the BCD to Seven Segment Decoder 108 is low, and both transistors 104 and 106 remain off regardless of the signal on the BCD INPUT.

The receiver subcircuit 110 senses a voltage on the touch switch rear pad 58, which functions as a receiver pad, to produce a positive (logic high) output voltage on the Touch Switch Signal Output terminal 112 whenever the touch pad 74 is not being touched and a signal is therefore capacitively coupled from the transmitter pad 52 through the dielectric panel 54 to the touch pad 74, and from the touch pad 74 again through the dielectric panel 54 to the receiver pad 58. When the touch pad 74 is touched, the signal available at the receiver pad 58 is attenuated. Insufficient signal reaches the amplifier 114, and the Touch Switch Signal Output terminal 112 goes low.

In FIG. 8, there is no specified time scale indicating the duration of the touch switch mode when the CONTROL INPUT terminal 128 is high and the duration of the display mode when the CONTROL INPUT 128 terminal is low. The relative durations of, and the ratios between, the operation of these two modes is determined as a function of the requirements of the external utilization device (not shown) and the use to which the integrated entry/display system of the present invention is put. A multitude of different control systems are possible. In some systems, it may be desired to operate the device of the invention in the touch switch mode and the display mode at entirely different times. For example, when the display is off, it may be desired to have the touch switch mode activated, and once the touch switch mode is activated, to have the display come on, with the touch switch mode then inactivated.

In other systems, it may be desired to operate the two modes essentially simultaneously. In this event, relatively rapid multiplexing can be employed wherein the display mode is enabled so frequently, for example forty times per second, that due to persistence of vision it appears continuous to the user. The Touch Switch Signal Output 112 is sampled at the same rate, that is twenty times per second, enabling practically instantaneous recognition when a touch occurs.

While the circuitry 80 of FIG. 7 is shown operating the embodiment of FIG. 5, it will be appreciated that the circuitry may as well be employed to operate the embodiment of FIG. 6. However, in the case of the FIG. 6 embodiment, both the touch switch mode and the display mode may in fact be operated simultaneously, with no multiplexing required, due to the greatly decreased electrical noise picked up by the receiver pad 58' which is outside of the gas-filled chamber 62. In this case, the electrode 52 is continuously driven at a frequency selected for compatibility with both the need to have an effectively AC signal for proper operation of the capacitive attenuator touch switch, and the need to provide an exciting waveform suitable for operation of the display. These requirements are somewhat inconsistent in that the display frequency is preferably between 0 and 4 kHz, and the touch switch frequency is preferably from 10 to 100 kHz. Nevertheless, a suitable frequency has been found to be in the order of 2 kHz. The FIG. 7 circuitry may readily be modified to achieve this result by eliminating the CONTROL INPUT, eliminating the NAND gate 126 and connecting the output of the multivibrator 124 directly to the line 98, and continuously enabling the BCD to Seven Segment Decoder 108.

Referring now to FIG. 9, which may be generally compared to FIG. 6, there is shown a modification wherein the display portion of the device is a liquid crystal display operating at fairly low voltage, for example twelve volts, rather than a gas discharge display. As is known in the art, a conventional liquid crystal display includes a pair of spaced electrodes and a body of liquid crystal compound substantially filling the space between the electrodes. Typically, the electrodes are deposited on facing surfaces of glass panel material, and rather closely spaced. When a suitable voltage source, either AC or DC, is electrically connected to the spaced electrodes, an electric field is established therebetween which alters the alignment of the molecules of the liquid crystal compound resulting in a visible change in optical characteristic. Such liquid crystal displays may be of two types, one of which is a reflective type wherein only the outer electrode need be optically transmissive. When energized, the reflectivity of the portion of the liquid crystal compound subject to the electric field between the electrodes changes with respect to the surrounding liquid crystal compound, resulting in a visible display. Liquid crystal displays may also be of a transmissive type wherein both electrodes as well as the substrates are optically transmissive, and a source of light is positioned behind the liquid crystal display panel. When energized, the optical transmission characteristics of the liquid crystal compound visibly change to produce the display effect. For further information concerning liquid crystal displays, reference may be had to the Williams U.S. Pat. No. 3,322,485.

Referring now to FIG. 9 in detail, the electrodes 52 and 66 respectively comprise the pair of spaced electrodes of a liquid crystal display. Between the electrodes 52 and 66 is a body 134 of liquid crytal compound. In all other respects, the embodiment of FIG. 9 is substantially unchanged with respect to that of FIG. 6, and accordingly bears the same reference numerals to designate corresponding elements.

The operation of FIG. 9 is substantially indentical to that of FIG. 6, with the exception that the driving voltages involved for the liquid crystal display of FIG. 9 are much lower than those for the gas discharge display of FIG. 6. Accordingly, suitable modifications are required to the circuit of FIG. 7, primarily to provide a suitable driving signal compatible with the liquid crystal display, and to increase the sensitivity of the touch switch signal output circuitry comprising the operational amplifier 114 to compensate for the reduction in available touch switch drive signal. In this respect, it should be noted that capacitance through the panel 54 may be increased, thereby resulting in increased signal level for the touch switch circuitry, by simply decreasing the panel thickness. With the relatively low operating voltages of the liquid crystal display, there is no particular concern with the possibility of electric shock to the user in the event of panel breakage, thus justifying a decrease in panel thickness.

It was noted above that one of the purposes of removing the receiver pad 58' to the outside of the gas-filled chamber 64 of FIG. 6 was to minimize interference to the touch switch circuitry caused by operation of the gas discharge display. An additional reason for removing the receiver pad 58' from the body 134 of the liquid crystal material in FIG. 9 is to avoid interference to the liquid crystal display caused by the presence of the electrode 58'. Accordingly, in liquid crystal embodiments, it is preferable to have the rear pad 58' outside of the body 134 of liquid crystal compound even where it is not desired to operate the display and the touch switch portions of the device simultaneously.

Figure 10:
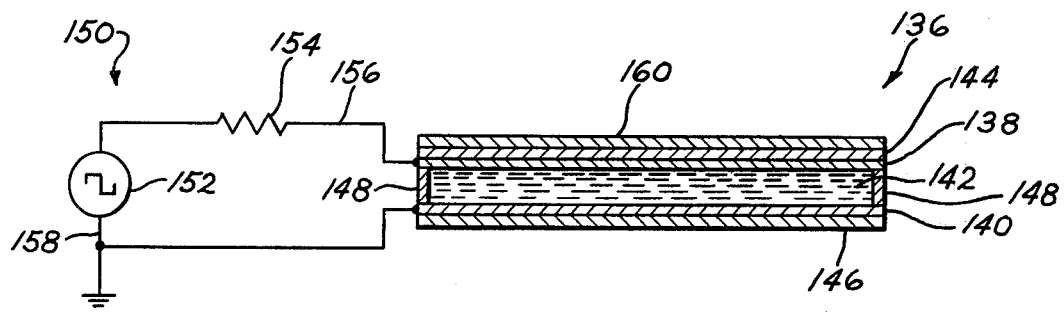
FIG. 10 is a cross-sectional view of another embodiment including a liquid crystal display, with a slightly different principle of operation for touch input.

Referring now to FIG. 10, there is shown a cross-sectional view of another integrated entry/display system 136 which comprises a liquid crystal display, but which has a slightly different principle of operation for touch input. In FIG. 10, there are a pair of spaced electrodes 138 and 140 with a body 142 of liquid crystal compound having at least a portion substantially filling a space between the electrodes 138 and 140. At least one of the electrodes 138 and 140 is optically transmissive, and in the illustrated embodiment the optically transmissive electrode is the front electrode 138. In the case of a transmission type liquid crystal display, the other electrode 140 is also optically transmissive.

The electrodes 138 and 140 are carried by suitable panels or substrates 144 and 146. In FIG. 10, the panel 144 is the front panel, and also is optically transmissive. The panel 144 is of suitable dielectric material, for example glass. Suitable seals 148 surround the edge of the body 142 of liquid crystal compound.

For operating the FIG. 10 device as a liquid crystal display there is provided an AC voltage source 150 comprising substantial series impedance. In FIG. 10, the voltage source 150 is shown as comprising an ideal voltage source 152 in the form of a square wave generator and a discrete impedance circuit element in the form of a resistor 154 in series with the ideal voltage generator 152. While this series impedance for convenience is shown as a discrete resistor 154, it will be appreciated that other impedance elements such as capacitors and adductors are possible, as well as circuits including active devices. Further, all or part of the series circuit impedance may be included as internal impedance of the voltage supply itself.

The AC voltage source 150 has two terminals 156 and 158 which are respectively electrically connected to the spaced electrodes 138 and 140 to establish an electric field therebetween sufficient to visibly change an optical characteristic of the portion of the body 142 of liquid crystal compound which is between the electrodes 138 and 140 and subject to the field, as is well known in the art. The terminal 158 is also connected to circuit ground. While this ground connection is shown schematically as a direct connection, it will be appreciated that an electrically effective ground connection may be to any suitable ground reference, and that the ground connection may be capacitive.

In particular accordance with the present invention, an optically transmissive touch switch front pad 160 is adjacent the side of the dielectric panel 144 opposite the one electrode 138, and arranged for capacitive coupling through the panel 144 with the electrode 138. The capacitance between the touch switch front pad 160 and the electrode 138 is selected such that when a user touches the touch pad 160 and effectively electrically shunts the pad 160 to ground, the voltage between the spaced electrodes 138 and 140 drops below that which is necessary to maintain the visible change in the body 142 of liquid crystal compound.

Figure 11:
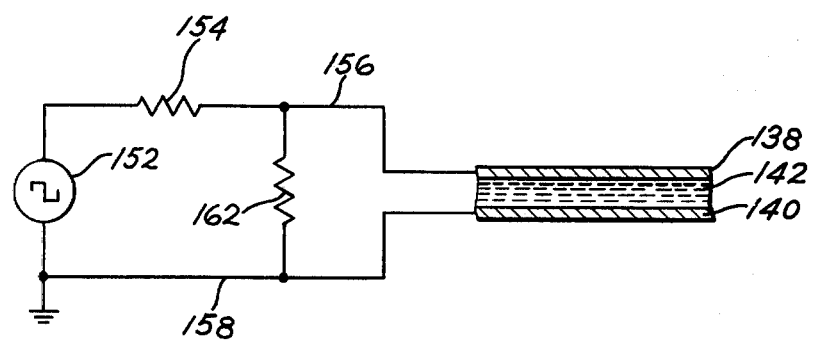
FIG. 11 is an electrical schematic diagram of the equivalent circuit when the embodiment of FIG. 10 is touched.

This operation may be better understood with reference to FIG. 11 which shows the equivalent electrical schematic diagram when the touch pad 160 of FIG. 10 is touched. In particular, in FIG. 11 there is shown an equivalent resistor 162, which in actual practice is primarily a capacitive reactance. The resistor 162 effectively shunts the voltage source terminal 156 to ground, producing a voltage divider configuration which reduces the voltage between the electrodes 138 and 140.

By way of example, this operation will now be described in terms of actual component values, although it will be understood that this is highly exemplary. By way of example, the series resistance 154 may be selected to have a value of one megohm. To reliably switch the liquid crystal display to the non-activiated condition, the circuit components are selected to drop the voltage across the electrodes 138 and 140, when the front pad 160 is touched, to one-third of the full voltage. In FIG. 11, this result is obtained when the equivalent resistor 162 has one half the value of the series resistor 154, or has a value of one-half megohm. (It will be appreciated that this simplified analysis neglects the effects of interelectrode capacitance between the electrodes 138 and 140). Accordingly, the areas of the touch pad 160 and the electrode 138, the spacing in between the touch pad 160 and the electrode 138, and the driving frequency are all selected to produce the desired capacitive reactance from the electrode 138 through the touch pad 160 to ground when the front pad 160 is touched.

In FIG. 10, no particular means is shown for connecting the device to other circuitry such that a control effect may be realized when the pad 160 is touched. An example of a suitable technique to accomplish this result is to provide circuitry to sense the signal level on the touch pad 160, preferably through physically extending the front panel 144 and the touch pad 160 such that a conventional touch switch rear pad may be provided on the rear side of the panel 144 capacitively coupled to the front pad 160. Another possibility is to directly sense the change in optical characteristic of the body 142 of liquid crystal material, for example by employing a photoelectric circuit.

It will be apparent therefore that the present invention provides an approach to integrating both an input and a display into a single system which makes possible both savings in panel area and in driving circuitry.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. An integrated entry/display system comprising:
   a dielectric panel;
   a display having at least one electrode adjacent one side of said dielectric panel;
   a capacitive attenuator touch switch rear pad adjacent the one side of said dielectric panel and electrically insulated from said one display electrode;
   a capacitive attenuator touch switch front pad adjacent the other side of said dielectric panel and arranged for capacitive coupling through said panel with both said one display electrode and said touch switch rear pad; and
   circuitry for operating said display by applying a suitable signal to said one display electrode; and for operating said one display electrode, said touch switch rear pad and said touch switch front pad together as a capacitive attenuator touch switch by applying an effectively AC exciting voltage to one of said one display electrode and said touch switch rear pad and sensing the resultant signal capacitively coupled to the other of said one display electrode and said touch switch rear pad to detect a decrease in the coupled signal when said touch switch front pad is touched.

2. An integrated entry/display system according to claim 1, wherein:
   said one of said one display electrode and said touch switch rear pad to which an effectively AC exciting voltage is applied is said one display electrode, which serves as a capacitive attenuator touch switch transmitter pad; and said other of said one display electrode and said touch switch rear pad to which the resultant signal is capacitively coupled is said touch switch rear pad, which serves as a capacitive attenuator touch switch receiver pad.

3. An integrated entry/display system according to claim 2, wherein said display is a gas discharge display having at least two spaced electrodes within a sealed, gas-filled chamber.

4. An integrated entry/display system according to claim 3, wherein:

said one display electrode which also serves as an element of a capacitive attenuator touch switch is a display anode; and the other of said display electrodes is a display cathode.

5. An integrated entry/display system according to claim 3, wherein said capacitive attenuator touch switch rear pad is within the same gas-filled chamber as said display electrodes.

6. An integrated entry/display system according to claim 5, wherein said circuitry operates the various elements of said system as a display and as a capacitive attenuator touch switch at different times.

7. An integrated entry/display system according to claim 6, wherein the suitable signal applied to said one display electrode in a steady DC voltage.

8. An integrated entry/display system according to claim 3, wherein said capacitive attenuator touch switch rear pad is outside of said gas-filled chamber.

9. An integrated entry/display system according to claim 8, wherein the suitable signal which said circuitry applies to said one display electrode is the effectively AC exciting voltage and the various elements of said system operate as a display and as a capacitive attenuator touch switch at the same time.

10. An integrated entry/display system according to claim 2, wherein said display is a liquid crystal display having a pair of spaced electrodes and a body of liquid crystal compound substantially filling the space between said pair of electrodes, one of said pair of spaced electrodes being said one display electrode.

11. An integrated entry/display system according to claim 10, wherein said capacitive attenuator touch switch rear pad is outside of said body of liquid crystal compound.

12. An integrated entry/display system according to claim 1, wherein said display is a gas discharge display having at least two spaced electrodes within a sealed, gas-filled chamber.

13. An integrated entry/display system according to claim 12, wherein:

said one display electrode which also serves as an element of a capacitive attenuator touch switch is a display anode; and the other of said display electrodes is a display cathode.

14. An integrated entry/display system according to claim 13, which comprises a plurality of display cathode electrodes having individual control elements for selectively connecting corresponding display cathode elements to a relatively negative potential.

15. An integrated entry/display system according to claim 12, wherein said capacitive attenuator touch switch rear pad is within the same gas-filled chamber as said display electrodes.

16. An integrated entry/display system according to claim 15, wherein said circuitry operates the various elements of said system as a display and as a capacitive attenuator touch switch at different times.

17. An integrated entry/display system according to claim 16, wherein the suitable signal applied to said one display electrode is a steady DC voltage.

18. An integrated entry/display system according to claim 12, wherein said capacitive attenuator touch switch rear pad is outside of said gas-filled chamber.

19. An integrated entry/display system according to claim 18, wherein the suitable signal which said circuitry applies to said one display electrode is the effectively AC exciting voltage and the various elements of said system operate as a display and as a capacitive attenuator touch switch at the same time.

20. An integrated entry/display system according to claim 1, wherein said display is a liquid cyrstal display having a pair of spaced electrodes and a body of liquid crystal compound substantially filling the space between said pair of electrodes, one of said pair of spaced electrodes being said one display electrode.

21. An integrated entry/display system according to claim 20, wherein said capacitive attenuator touch switch rear pad is outside of said body of liquid crystal compound.

22. An integrated entry/display system according to claim 1, wherein said circuitry operates the various elements of said system as a display and as a capacitive attenuator touch switch at different times.

23. An integrated entry/display system according to claim 22, wherein the suitable signal applied to said one display electrode is a steady DC voltage.

24. An integrated entry/display system according to claim 1, wherein the suitable signal which said circuitry applies to said one display electrode is the effectively AC exciting voltage and the various elements of said system operate as a display and as a capacitive attenuator touch switch at the same time.

25. An integrated entry/display system comprising:

a dielectric panel;

a gas discharge display having at least two spaced electrodes within a sealed, gas-filled chamber, one of said display electrodes being a display anode and positioned adjacent one side of said dielectric panel;

a capacitive attenuator touch switch receiver pad adjacent the one side of said dielectric panel and electrically insulated from said display anode electrode;

a capacitive attenuator touch switch front pad adjacent the other side of said dielectric panel and arranged for capacitive coupling through said panel with both said display anode electrode and said capacitive attenuator touch switch receiver pad; and circuitry for operating said display by applying a suitable signal to said display anode electrode; and for operating said display anode electrode, said touch switch receiver pad, and said touch switch front pad together as a capacitive attenuator touch switch by applying an effectively AC exciting voltage to said display anode electrode such that said display anode electrode also serves as a capacitive attenuator touch switch transmitter pad and sensing the resulting signal capacitively coupled to said receiver pad to detect a decrease in the coupled signal when said touch switch front pad is touched.

26. An integrated entry/display system according to claim 25, wherein said capacitive attenuator touch switch receiver pad is within the same gas-filled chamber as said display electrode.

27. An integrated entry/display system according to claim 26, wherein said circuitry operates the various elements of said system as a display and as a capacitive attenuator touch switch at different times.

28. An integrated entry/display system according to claim 27, wherein the suitable signal applied to said one display electrode is a steady DC voltage.

29. An integrated entry/display system according to claim 25, wherein said capacitive attenuator touch switch receiver pad is outside of said gas-filled chamber.

30. An integrated entry/display system according to claim 29, wherein the suitable signal which said circuitry applies to said one display electrode is the effectively AC exciting voltage and the various elements of said system operate as a display and as a capacitive attenuator touch switch at the same time.

* * * * *